(12) United States Patent
Winstead et al.

(10) Patent No.: US 8,587,039 B2
(45) Date of Patent: Nov. 19, 2013

(54) METHOD OF FORMING A SEMICONDUCTOR DEVICE FEATURING A GATE STRESSOR AND SEMICONDUCTOR DEVICE

(75) Inventors: Brian A. Winstead, Austin, TX (US); Konstantin V. Loiko, Austin, TX (US); Voon-Yew Thean, Fishkill, NY (US)

(73) Assignee: Freescale Semiconductor, Inc., Austin, TX (US)

( * ) Notice: Subject to any disclaimer, the term of this patent is extended or adjusted under 35 U.S.C. 154(b) by 286 days.

(21) Appl. No.: 13/112,077

(22) Filed: May 20, 2011

(65) Prior Publication Data

US 2011/0220975 A1 Sep. 15, 2011

Related U.S. Application Data

(62) Division of application No. 11/756,231, filed on May 31, 2007, now Pat. No. 7,960,243.

(51) Int. Cl.
*H01L 29/76* (2006.01)

(52) U.S. Cl.
USPC ............ 257/288; 257/E29.242; 257/E21.623; 257/E21.637; 438/407; 438/423; 438/440; 438/480; 438/585; 438/588; 438/591; 438/659

(58) Field of Classification Search
None
See application file for complete search history.

(56) References Cited

U.S. PATENT DOCUMENTS

| 4,356,041 | A | 10/1982 | Kosa |
|---|---|---|---|
| 4,495,219 | A | 1/1985 | Kato et al. |
| 4,755,865 | A | 7/1988 | Gregory et al. |
| 6,278,165 | B1 | 8/2001 | Oowaki et al. |
| 6,380,014 | B1 | 4/2002 | Ohta et al. |
| 6,461,984 | B1 | 10/2002 | Han et al. |
| 6,468,915 | B1 | 10/2002 | Liu |
| 6,808,974 | B2 | 10/2004 | Park et al. |
| 7,151,023 | B1 | 12/2006 | Nayfeh et al. |
| 7,279,413 | B2 | 10/2007 | Park et al. |
| 7,368,356 | B2 | 5/2008 | Li |
| 7,498,643 | B2 | 3/2009 | Kamimuta et al. |
| 7,504,704 | B2 | 3/2009 | Currie et al. |
| 2003/0111699 | A1 | 6/2003 | Wasshuber et al. |
| 2004/0023478 | A1 | 2/2004 | Samavedam et al. |
| 2004/0178470 | A1 | 9/2004 | Hieda |
| 2005/0037596 | A1 | 2/2005 | Dempsey et al. |
| 2005/0056887 | A1 | 3/2005 | Tran |

(Continued)

FOREIGN PATENT DOCUMENTS

| JP | 03177027 | 8/1991 |
|---|---|---|
| JP | 09022999 | 1/1997 |

(Continued)

OTHER PUBLICATIONS

PCT International Search Report mailed Sep. 26, 2008 for PCT/US2008/064105, 4 pages.

*Primary Examiner* — Yasser Abdelaziez (57) ABSTRACT

A semiconductor device is formed in a semiconductor layer. A gate stack is formed over the semiconductor layer and comprises a first conductive layer and a second layer over the first layer. The first layer is more conductive and provides more stopping power to an implant than the second layer. A species is implanted into the second layer. Source/drain regions are formed in the semiconductor layer on opposing sides of the gate stack. The gate stack is heated after the step of implanting to cause the gate stack to exert stress in the semiconductor layer in a region under the gate stack.

19 Claims, 5 Drawing Sheets

(56) References Cited

U.S. PATENT DOCUMENTS

| | | |
|---|---|---|
| 2005/0112857 A1 | 5/2005 | Cabral et al. |
| 2005/0266631 A1 | 12/2005 | Kim et al. |
| 2005/0282325 A1 | 12/2005 | Belyansky et al. |
| 2005/0282341 A1 | 12/2005 | Gluschenkov et al. |
| 2006/0011990 A1 | 1/2006 | Furukawa et al. |
| 2006/0017112 A1 | 1/2006 | Wang et al. |
| 2006/0043497 A1 | 3/2006 | Kimizuka et al. |
| 2006/0068556 A1 | 3/2006 | Noda |
| 2006/0081942 A1 | 4/2006 | Saito |
| 2006/0138541 A1 | 6/2006 | Nakamura et al. |
| 2006/0145274 A1 | 7/2006 | Chidambarrao et al. |
| 2006/0160317 A1 | 7/2006 | Zhu et al. |
| 2006/0163678 A1 | 7/2006 | Anezaki |
| 2006/0172497 A1 | 8/2006 | Hareland et al. |
| 2006/0282325 A1 | 12/2006 | Martin |
| 2006/0286747 A1 | 12/2006 | Mouli et al. |
| 2007/0042547 A1 | 2/2007 | Kikuchi et al. |
| 2007/0161170 A1 | 7/2007 | Orlowski et al. |
| 2007/0166970 A1 | 7/2007 | Triyoso et al. |
| 2013/0130457 A1 | 5/2013 | Sayama et al. |

FOREIGN PATENT DOCUMENTS

| | | |
|---|---|---|
| JP | 1998144880 A | 5/1998 |
| JP | 2004172389 A | 6/2004 |
| JP | 2006120718 A | 5/2006 |
| JP | 2006521026 A | 9/2006 |

METHOD OF FORMING A SEMICONDUCTOR DEVICE FEATURING A GATE STRESSOR AND SEMICONDUCTOR DEVICE

CROSS-REFERENCE TO RELATED APPLICATION(S)

The present application is a divisional of co-pending U.S. patent application Ser. No. 11/756,231, entitled "Method of Forming a Semiconductor Device Featuring a Gate Stressor and a Semiconductor Device," filed on May 31, 2007, the entirety of which is herein incorporated by reference.

BACKGROUND

1. Field of the Disclosure

This disclosure relates generally to semiconductor devices, and more specifically, to methods of forming a semiconductor device featuring a gate stressor and semiconductor device.

2. Related Art

Current NMOS process-induced stressors such as tensile etch stop layer (ESL) or embedded silicon carbon (eSiC) are either (i) relatively weak and not scalable to small pitches or else (ii) not easily manufacturable. In addition, the current NMOS process-inducted stressors do not induce significant stress in longer channel devices, for example, non-volatile memory (NVM), power, or analog devices.

Accordingly, there is a need for an improved method and apparatus for overcoming the problems in the art as discussed above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A semiconductor device featuring a gate stressor as disclosed herein advantageously provides a strong, manufacturable stressor for NMOS metal gate devices. The gate stressor is advantageously scalable to small pitches, for example, on the order of sub-micron pitches, for both short and long channel devices. In addition, the stress may be scaled to even higher levels by the thinning of a corresponding metal gate. Furthermore, the gate stressor according to the embodiments of the present disclosure can be advantageously used additively with current tensile etch stop layer (ESL) and embedded stressors. According to one embodiment, a structure and method provides for NMOS performance enhancement using oxidation of the region above a metal gate. For example, the oxidation above the metal gate can be used to induce large, mobility-enhancing stress to the NFET channel of the device. In addition, the masking of the gate contact pad with an implant block during the oxygen implant advantageously reduces any undesirable or adverse impact on the gate contact pad.

Examples of sources of NMOS mobility enhancement provided by the gate stressor according to the embodiments of the present disclosure include one or more of (i) vertical compression in the channel, (ii) lateral tension in the channel, and (iii) width tension in the channel. In addition to NMOS mobility enhancement, these stresses tend to reduce threshold voltage (Vt) which is typically advantageous for performance of metal gate devices.

Figure 1:
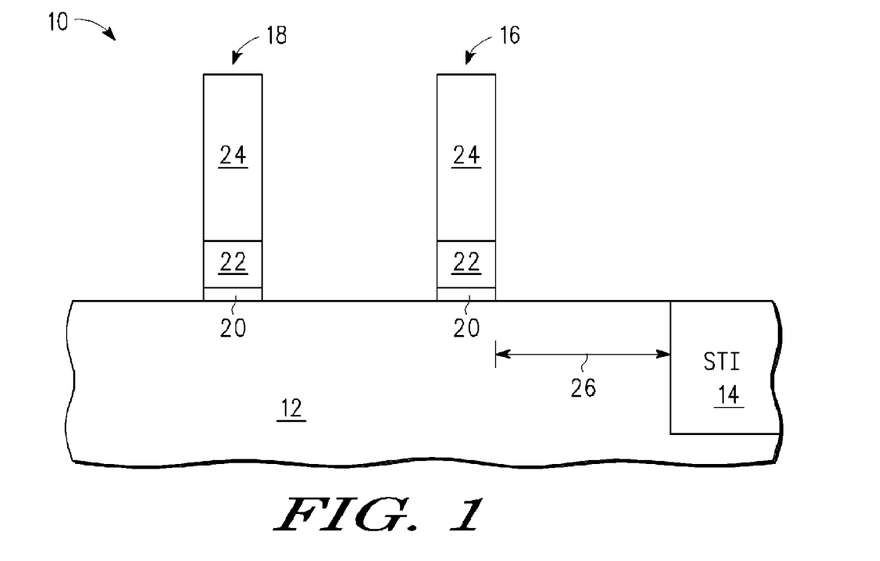
FIG. 1 is a partial cross-sectional view a portion of a semiconductor device during one stage in the manufacture thereof, wherein the device will feature a metal gate stressor according to one embodiment of the present disclosure.
Figure 2:
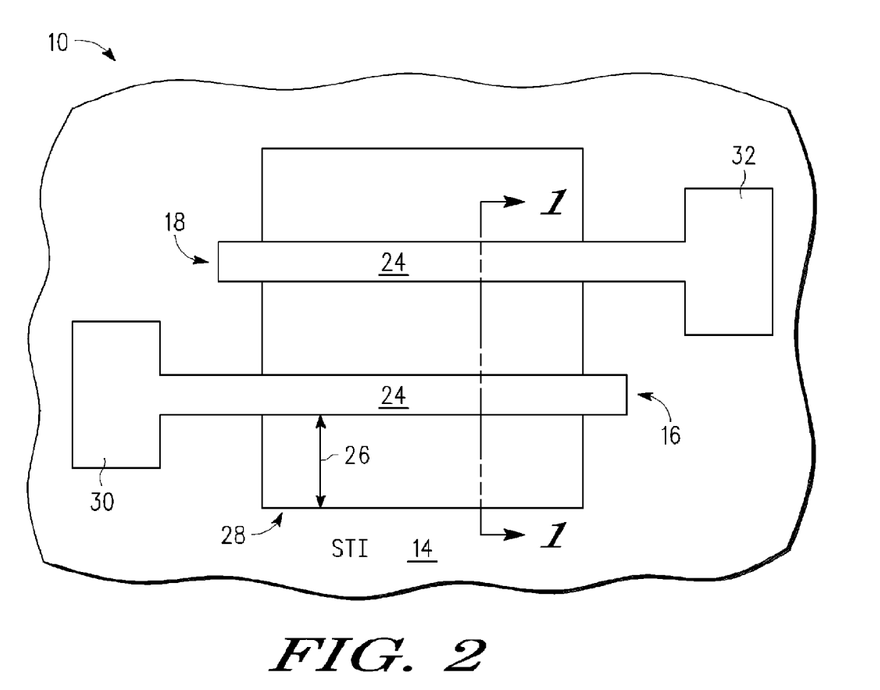
FIG. 2 is a top down view of the portion of the semiconductor device of FIG. 1.

FIG. 1 is a partial cross-sectional view a portion of a semiconductor device 10 during one stage in the manufacture thereof, wherein the device 10 will feature a metal gate stressor according to one embodiment of the present disclosure. Included in the partial cross-sectional view of the portion of the semiconductor device 10 is a semiconductor layer 12. In one embodiment, semiconductor layer 12 can comprise any semiconductor material or combinations of materials, such as gallium arsenide, silicon germanium, silicon-on-insulator (SOI), silicon, monocrystalline silicon, the like, and combinations of the above. The semiconductor device 10 also includes one or more isolation region 14 (only one region is shown in FIG. 1). Isolation region 14 can comprise, for example, shallow trench isolation that defines a desired active semiconductor device region 28 (FIG. 2). Isolation region 14 is formed using any suitable technique.

Semiconductor device 10 further includes gate stacks 16 and 18. In one embodiment, gate stacks 16 and 18 comprise metal gate stacks that include a gate dielectric 20, gate metal 22, and polycrystalline semiconductor 24. The particular composition, thickness, and characteristics of gate dielectric 20, gate metal 22, and polycrystalline semiconductor 24 are each selected according to the requirements for a given gate stack of a desired semiconductor device application, and thus not further discussed herein. In one embodiment, gate dielectric 20 comprises hafnium zirconium oxide (HfZrOx) with a density on the order of 8 g/cm$^3$, gate metal 22 comprises tantalum carbon (TaC) having a density on the order of 14 g/cm$^3$, and polycrystalline semiconductor 24 comprises polysilicon. In addition, FIG. 1 illustrates a gate-to-isolation spacing or dimension, which is illustrated by reference numeral 26. The gate-to-isolation spacing represents a distance from an edge of a gate stack to an edge of an adjacent isolation region, as will be discussed further herein.

FIG. 2 is a top down view of the portion of the semiconductor device 10 of FIG. 1. Illustrated in FIG. 2 is the boundary of the active device region, indicated by reference numeral 28. In addition, gate contact pads 30 and 32 of corresponding gate stacks 16 and 18 are illustrated. Note that the gate contact pads 30 and 32 are located outside the boundary of the active region 28. Subsequently formed device contacts (not shown) will make contact to a portion of the corresponding gate stack 16 or 18 in the region of the gate contact pads 30 and 32, respectively. The cross-sectional view of the portion of the semiconductor device 10 of FIG. 1 is taken along line 1-1 of FIG. 2.

Figure 3:
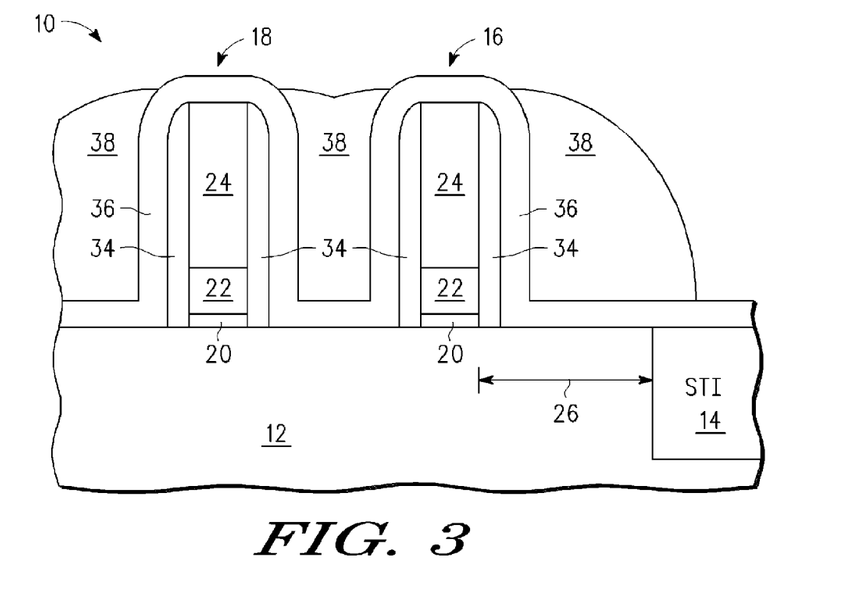
FIG. 3 is a partial cross-sectional view the portion of the semiconductor device of FIG. 1 during another stage in the manufacture thereof.

FIG. 3 is a partial cross-sectional view the portion of the semiconductor device 10 of FIG. 1 during another stage in the manufacture thereof. FIG. 3 illustrates sidewall zero-spacers 34 formed along sidewalls of gate stacks 16 and 18. In one embodiment, sidewall zero-spacers 34 comprise nitride spacers that provide protection for the gate metal and gate dielectric of the gate stacks 16 and 18, during subsequent processing steps. While FIG. 3 illustrates the spacers as protecting sidewalls of both the gate metal and gate dielectric, the spacers could be formed only along the sidewalls of the metal gate with a corresponding portion of gate dielectric below the spacers. The sidewall spacers could also comprise any suitable material in addition to nitride or other than nitride. In addition, a protective liner 36 is formed overlying the structure, wherein the protective liner provides a level of protection for an underlying layer (or layers) during a subsequent processing step or steps. In one embodiment, the protective liner 36 comprises an oxide liner. Furthermore, FIG. 3 illustrates an implant block 38, wherein the implant block provides protection of an underlying layer or layers from a subsequent implantation step for implanting a stressor species (as will be discussed further herein below). In one embodiment, implant block 38 comprises at least one selected from the group comprising SiN and TiN. As shown, implant block 38 is formed as a large spacer, for example, using any suitable technique(s) known in the art for the formation of sidewall spacers. In one embodiment, implant block 38 is formed such that the implant block coverage is (i) greater than or equal to the gate pitch and (ii) greater than or equal to the gate-to-isolation spacing 26. Gate pitch is defined as the center-line spacing between adjacent gate stacks.

Figure 4:
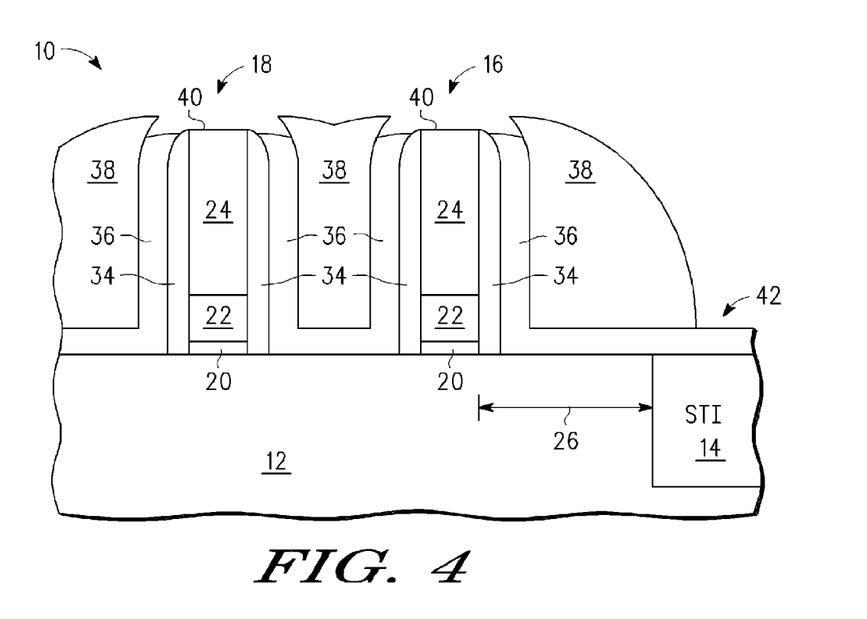
FIG. 4 is a partial cross-sectional view the portion of the semiconductor device of FIG. 3 during a further stage in the manufacture thereof.

FIG. 4 is a partial cross-sectional view the portion of the semiconductor device 10 of FIG. 3 during a further stage in the manufacture thereof. In particular, in one embodiment, the structure of FIG. 3 is processed using any suitable etch to expose a top surface 40 of polycrystalline semiconductor 24 for each gate stack 16 and 18. The etch can include, for example, any suitable dry or wet etch. In addition, the etch exposes a portion of the isolation region 14, as indicated by reference numeral 42. In another embodiment, the structure of FIG. 3 is not processed using an etch; however, the processing advances to that discussed herein below with respect to FIG. 5.

Figure 5:
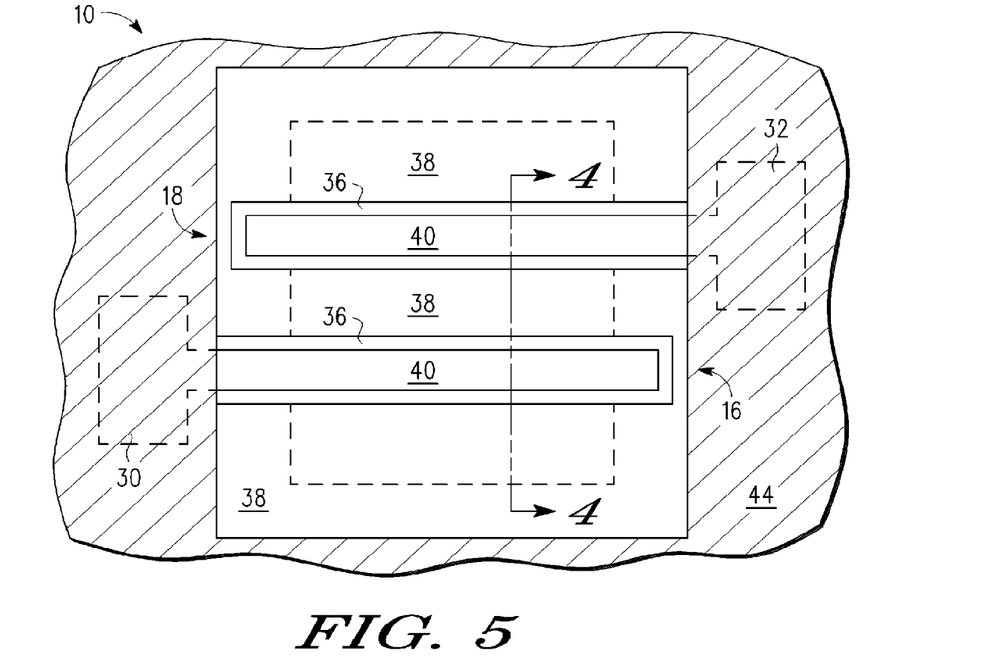
FIG. 5 is a top down view of the portion of the semiconductor device of FIG. 4.

Subsequent to the exposing of the top surface 40 of the polycrystalline semiconductor 24, the gate contact pad regions 30 and 32 are masked out using any suitable masking technique. FIG. 5 is a top down view of the portion of the semiconductor device of FIG. 4, illustrating the masking out of the gate contact pad regions 30 and 32, wherein the masking out includes forming an implant blocking mask 44. For example, the gate contact pad regions 30 and 32 can be masked out using a modified well-mask. The masking of the gate contact pad regions 30 and 32 advantageously provides a suitable implant block to the gate contact pad regions 30 and 32 during a subsequent implantation step for implanting a stressor species into the non-masked portions of the gate stacks 16 and 18 (as will be discussed further herein below). As illustrated in FIG. 5, the exposed surfaces 40 of the portions of the gate stacks 16 and 18 overlying the area of the active device region 28 are now prepared for the subsequent step of implanting with a stressor species. In addition, portions of the active device region 28 are protected via the implant block 38.

Figure 6:
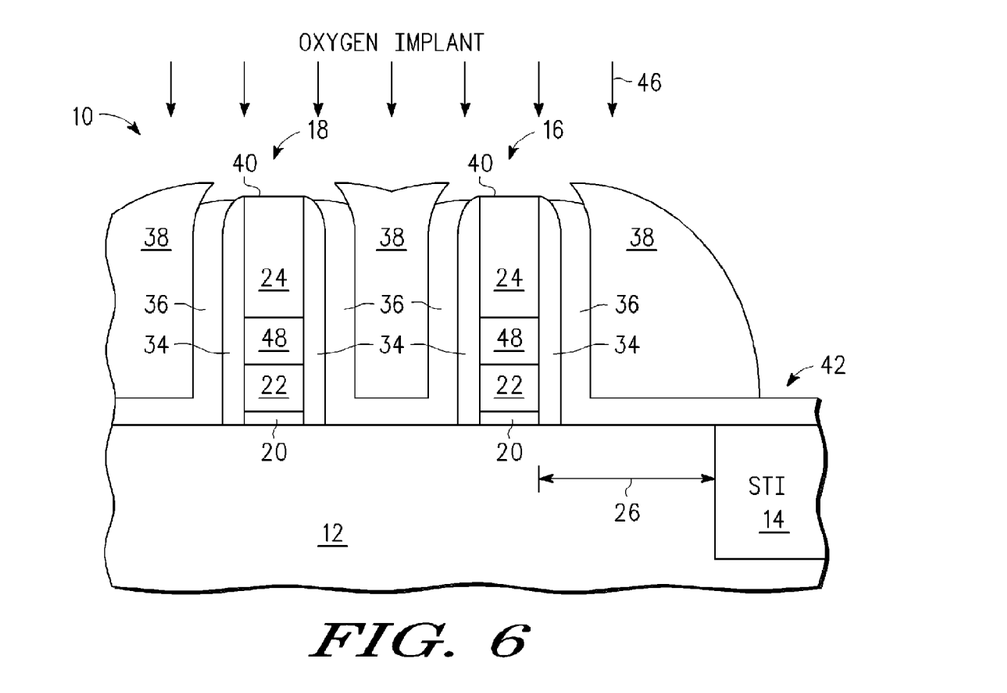
FIG. 6 is a partial cross-sectional view the portion of the semiconductor device of FIGS. 4 and 5 during an implanting stage in the manufacture thereof.

FIG. 6 is a partial cross-sectional view the portion of the semiconductor device 10 of FIGS. 4 and 5 during an implanting stage in the manufacture thereof. In one embodiment, the portion of the semiconductor device 10 of FIG. 6 is processed with a high dose oxygen implant 46, further as discussed below. The high dose oxygen implant stops on the gate metal 22 of gate stacks 16 and 18, and piles up within corresponding regions indicated by reference numeral 48, due to the higher stopping power of the gate metal 22. As a result, each region 48 provides conditions for subsequent oxide formation in a desired location within the corresponding gate stack. Furthermore, implant block 38 advantageously protects underlying regions of semiconductor layer 12, wherein the implant block 38 is characterized by an implant stopping power sufficient to inhibit the implant species from reaching the semiconductor layer 12. In particular, the implant block 38 prevents the implant species from reaching the underlying active semiconductor region 28 (FIG. 5), while enabling the placement of the implant species, as desired, within the gate stacks 16 and 18. In addition, source/drain regions, whether already formed or yet to be formed, are protected by the implant block 38. Furthermore, the implant blocking mask 44 advantageously protects the corresponding gate contact pad regions 30 and 32 from being implanted with the implant species. Moreover, the implant blocking mask 44 may also provide protection for other portions of the semiconductor layer 12 in the active device region 28 that may not be protected by implant block 38.

According to the embodiments of the present disclosure, the implant conditions, including implant energies and densities, are selected such that the high dose oxygen implant does not result in any significant amount of oxygen tailing into an underlying channel region of the device being formed. In other words, the implant energy is selected to be sufficient to effectively eliminate oxygen tailing for a metal gate of given thickness, while still providing sufficient density of oxygen at the interface between polysilicon and the metal gate of the gate stack. For example, in a polysilicon/TaC gate stack including a 10 nm thick TaC gate metal, the implant conditions can include a 1E18 oxygen implant at 25-35 keV, while providing a sufficient density of oxygen, for example, on the order of greater than approximately $1\ E23\ cm^{-3}$ at the polysilicon/TaC interface.

Other implant conditions are also possible. A range of implant profile width/depth conditions can be used to provide strong channel stress and a corresponding performance enhancement, for example, $Id_{sat}$ enhancement, including conditions which address oxygen tailing. Thus, the structures and methods for the gate stack as discussed herein can also be used alone or in combination with implant optimization to further reduce oxygen tailing. In one embodiment, a shorter gate stack permits use of a lower energy implant which would further improve control of oxygen tailing. In another embodiment, a thicker metal gate (e.g., TaC) increases oxygen stopping in the gate stack. In another embodiment, a high stopping power material can be deposited in the active region above the metal gate prior to polycrystalline semiconductor deposition. In yet another embodiment, a xenon (Xe) pre-amorphization implant (PAI) into the active region prior to polycrystalline semiconductor deposition to amorphize the top portion of the gate may increase stopping power.

Figure 7:
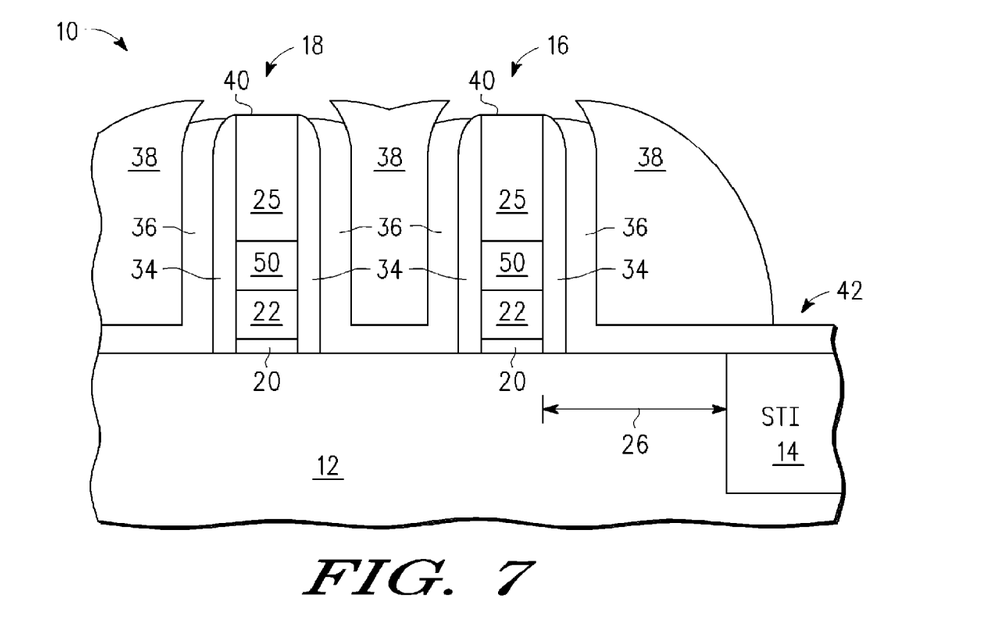
FIG. 7 is a partial cross-sectional view the portion of the semiconductor device of FIG. 6 during an annealing stage in the manufacture thereof.

FIG. 7 is a partial cross-sectional view the portion of the semiconductor device 10 of FIG. 6 during an annealing stage in the manufacture thereof. In one embodiment, the portion of semiconductor device 10 is processed with a high-temperature anneal, wherein the high-temperature anneal forms a stressor 50 in the implanted regions 48 (FIG. 6) of gate stacks 16 and 18. In one embodiment, the polycrystalline semiconductor 24 comprises one selected from polysilicon, silicon germanium, and silicon carbon, and the stressor 50 comprises an oxide, formed from the oxygen implanted regions 48 using the high-temperature anneal. In addition, the high-temperature anneal can comprise a suitable laser/spike anneal. Subsequent to the annealing stage, the implant block 38 is removed using any suitable techniques. For example, implant block 38 can be removed with a suitable etch, such as a hot phosphoric etch (for SiN) or a piranha etch (for TiN). In addition, the implant block 38 could be removed subsequent to the implanting stage and prior to the annealing stage.

Figure 8:
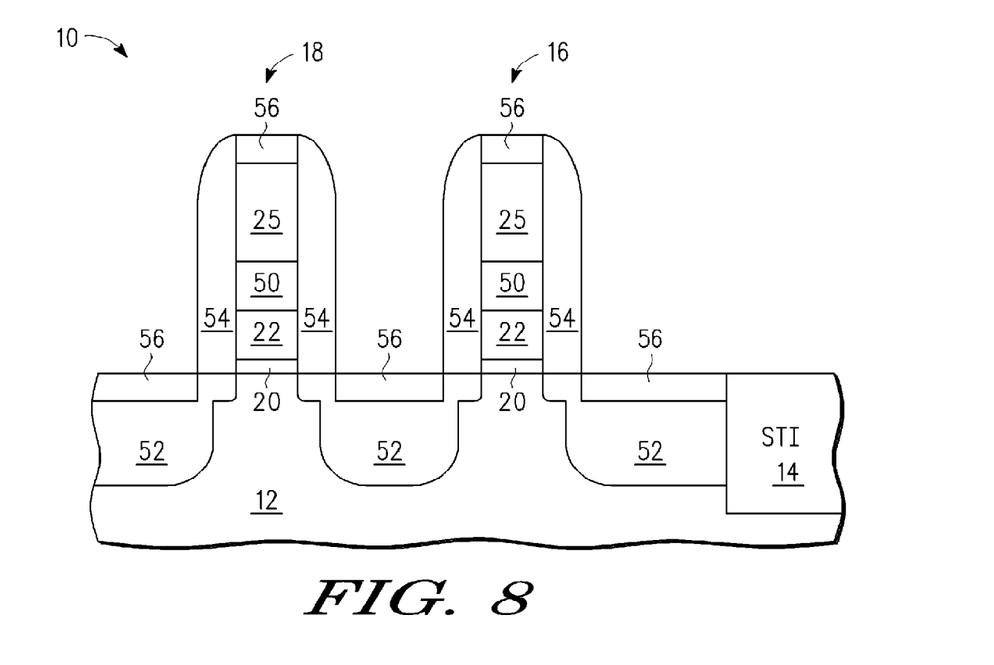
FIG. 8 is a partial cross-sectional view the portion of the semiconductor device of FIG. 7 during further processing in the manufacture thereof, the semiconductor device featuring a metal gate stressor according to one embodiment of the present disclosure.

FIG. 8 is a partial cross-sectional view the portion of the semiconductor device 10 of FIG. 7 during further processing in the manufacture thereof, the semiconductor device featuring a stressor 50 according to one embodiment of the present disclosure. Further processing includes formation of source/drain regions 52, sidewall spacers 54, silicide regions 56, using any suitable techniques for forming the same. Note that electrical contact to the silicide overlying the gate contact pad regions 30 and 32 of corresponding gate stacks 16 and 18 is not adversely affected by the presence of the metal gate stressor in the other portions of the gate stacks, since the implant was inhibited in the gate contact pad regions 30 and 32 via the implant blocking mask 44.

Figure 9:
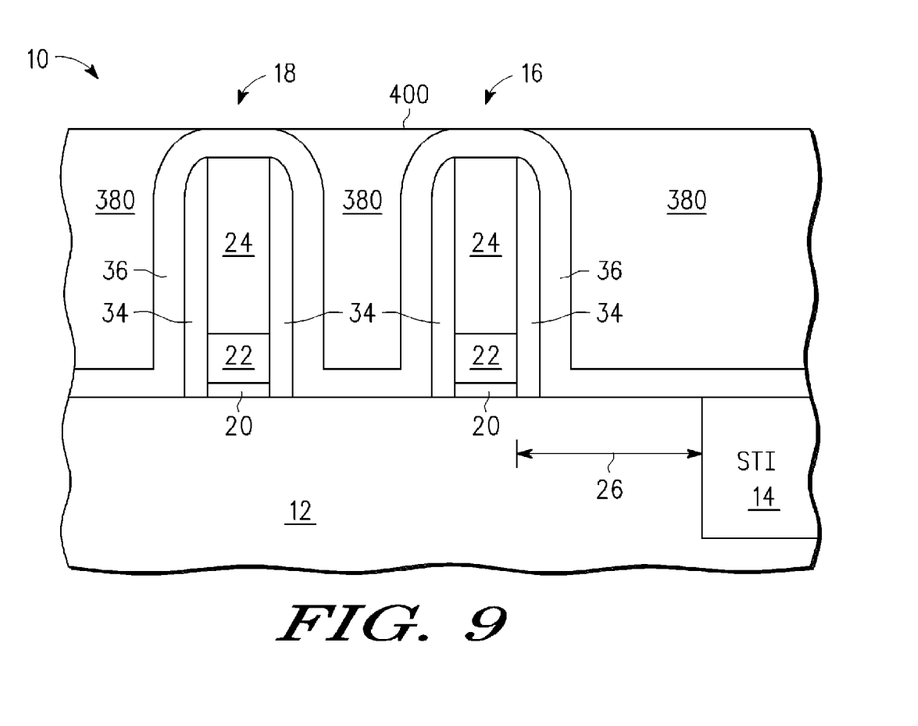
FIG. 9 is a partial cross-sectional view the portion of the semiconductor device of FIG. 1 in the manufacture thereof according to another embodiment.

FIG. 9 is a partial cross-sectional view the portion of the semiconductor device of FIG. 1 in the manufacture thereof according to another embodiment. In particular, FIG. 9 illustrates sidewall zero-spacers 34 formed along sidewalls of gate stacks 16 and 18. In one embodiment, sidewall zero-spacers 34 comprise nitride spacers that provide protection for the gate metal and gate dielectric of the gate stacks 16 and 18, during subsequent processing steps. In addition, a protective liner 36 is formed overlying the structure, wherein the protective liner provides a level of protection for an underlying layer (or layers) during a subsequent processing step or steps. In one embodiment, the protective liner 36 comprises an oxide liner. Furthermore, FIG. 9 illustrates an implant block 380, wherein the implant block provides protection of an underlying layer or layers from a subsequent implantation step for implanting a stressor species (as will be discussed further herein below). In one embodiment, implant block 380 comprises at least one selected from the group comprising SiN and TiN. As shown, implant block 380 is formed by blanket deposition and etch back, for example, using any suitable deposition and planarization technique(s) known in the art. In one embodiment, implant block 380 provides implant block coverage that includes coverage (i) greater than or equal to the gate pitch and (ii) greater than or equal to the gate-to-isolation spacing 26. As previously noted, gate pitch is defined as the center-line spacing between adjacent gate stacks. Planarization of implant block 380 can also include forming a surface 400. As illustrated, surface 400 includes an exposed portion of liner 36. In another embodiment, surface 400 can include a top surface of polycrystalline semiconductor 24 of gate stacks 16 and 18. Subsequent processing further continues as discussed herein above, with reference to FIGS. 5-8, in which implant block 380 is substituted for implant block 38.

According to the embodiments of the present disclosure, a method is provided for preventing oxygen from undesirably entering source/drain regions of semiconductor devices, wherein the semiconductor devices are characterized as having large gate-to-isolation region spacing dimensions. Implementation of stressors as discussed herein depends in part on the device layout. For example, dummy gates can be used during the process to compensate for large gate-to-isolation region spacing and to minimize a resulting dummy gate-to-isolation region spacing and thereby accommodate a corresponding spacer masking. As such, wide gate-to-isolation region spacing devices alone, in the absence of such dummy gates will not be suitable for preventing oxygen from entering corresponding source/drain regions. Since most high performance logic CMOS devices use close to minimum allowable gate-to-isolation region spacing, the method according to the embodiments of the present disclosure is very applicable.

In another embodiment, the method is suitable for applications which use large gate-to-isolation region spacing, wherein the method includes nitride deposition, followed by chemical mechanical planarization, prior to the oxygen implant step. This embodiment differs from the embodiment using nitride spacers, in that the nitride deposition is sufficient to cover the large gate-to-isolation region spacing wherein use of nitride spacers alone would be insufficient to cover the large gate-to-isolation region spacing of a given semiconductor device implementation.

In one embodiment, the semiconductor device provides correct stress in all directions to enhance NMOS device performance, wherein the stress includes providing lateral and width tension, as well as, vertical compression. For an orientation of (100)<110>, the NMOS semiconductor device is characterized as having a short channel $Id_{sat}$ response to lateral and width tension on the order of 1.9 and 0.2, respectively. In addition, the NMOS semiconductor device short channel $Id_{sat}$ response to vertical compression is on the order of 2.1. Furthermore, the units are percentage $Id_{sat}$ change per 100 MPa for a short channel device.

According to one embodiment, a structure and method use oxidation above a metal gate to induce large, mobility-enhancing stress to an NFET channel. The embodiments provide a strong, scalable, manufacturable stressor for NMOS. In addition, the stressor is scalable (e.g., thinner metal gate) and works for longer channel devices (e.g., for NVM, power, or analog devices). Furthermore, the embodiments can be used additively with conventional ESL stressors and with eSiC.

By now it should be appreciated that there has been provided a method of forming a semiconductor device in and over a semiconductor layer, comprising: forming a gate stack over the semiconductor layer comprising a first conductive layer and a second layer over the first conductive layer, wherein the first layer is more conductive and provides more stopping power to an implant than the second layer; implanting a species into the second layer; forming source/drain regions in the semiconductor layer on opposing sides of the gate stack; and heating the gate stack after the step of implanting to cause the gate stack to exert stress in the semiconductor layer in a region under the gate stack. The step of forming the gate stack is further characterized by the first conductive layer comprising a metal. The step of forming the gate stack is further characterized by the second layer comprising polysilicon. The step of implanting is further characterized by the species comprising oxygen. In one embodiment, the step of heating is before the step of forming the source/drain regions. In another embodiment, the step of heating is after the step of forming the source/drain regions.

In one embodiment, the step of forming the gate stack is further characterized by the gate stack comprising a gate dielectric between the semiconductor layer and the first conductive layer and over a channel between the source/drain regions. The step of forming the gate stack is further characterized by the gate stack being over an active region of the semiconductor layer and having an extension to a gate contact pad outside the active region, the method further comprising masking the gate contact pad while exposing the gate stack over the active region during the step of implanting. In yet another embodiment, the step of heating is further characterized by the stress comprising a tensile lateral stress and a compressive vertical stress.

In another embodiment, the method further comprises forming first sidewall spacers around the gate stack prior to the step of implanting; and removing the first sidewall spacers after the step of implanting and before the step of forming source/drain regions. In a further embodiment, the method further comprises depositing a filler layer over and around the gate stack; and performing chemical mechanical polishing on the filler layer prior to the step of implanting. In addition, the step of implanting is further characterized by the step of implanting having an energy that causes a maximum concentration of the species to be within 10 nanometers of the first conductive layer.

In a further embodiment, a method of forming a semiconductor device in and over a semiconductor layer, comprises; forming a gate stack over a channel region in the semiconductor layer, wherein the gate stack comprises a gate dielectric on the semiconductor layer, a metal layer over the gate dielectric, and a polysilicon layer over the metal layer; and implanting oxygen into the gate stack so that a maximum concentration of the oxygen from the implanting is in the second layer and is within 10 nanometers of the metal layer; forming source/drain regions in the semiconductor layer on opposing sides of the gate stack; and heating the gate stack after the step of implanting to cause the oxygen to react with the polysilicon layer. The method further comprises forming a sidewall spacer around the gate stack prior to the step of implanting: and removing the sidewall spacer prior to the step of forming the source/drain regions. The step of forming the gate stack is further characterized by the metal layer comprising tantalum and carbon. In another embodiment, the step of forming the gate stack is further characterized by the gate stack being over an active region of the substrate layer and having an extension to a gate contact pad outside the active region, the method further comprising masking the gate contact pad while exposing the gate stack over the active region during the step of implanting.

In yet another embodiment, a semiconductor device, comprises: a semiconductor layer; a gate stack over the substrate comprising: a first conductive layer over the semiconductor layer; a second layer over the first layer, wherein the first layer is more conductive and provides more stopping power to an implant than the second layer; a stressor located in the second layer within 10 nanometers of the first conductive layer; and source/drain regions in the semiconductor layer on opposite sides of the gate stack. In one embodiment, the stressor adjoins the first conductive layer. In another embodiment, the first conductive layer comprises a metal, the second layer comprises polysilicon, and the stressor comprises oxide. The stressor generates a lateral tensile stress in a channel region in the semiconductor layer under the gate stack and between the source/drain regions.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the gate dielectric can comprise a stack of dielectric materials, the metal gate can comprise a stack of metals, oxide spacers may be used in place of nitride spacers, etc. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device, comprising:
 a semiconductor layer;
 a gate stack over the semiconductor layer comprising:
  a first layer comprising a metallic element over the semiconductor layer;
  a second layer over the first layer, wherein the first layer is more conductive and provides more stopping power to an implant than the second layer;

a stressor located in the second layer within 10 nanometers of the first layer; and source/drain regions in the semiconductor layer on opposite sides of the gate stack.

2. The semiconductor device of claim 1, wherein the stressor adjoins the first layer.

3. The semiconductor device of claim 1, wherein the second layer comprises polysilicon.

4. The semiconductor device of claim 1, wherein the stressor comprises oxide.

5. The semiconductor device of claim 3, wherein the stressor comprises oxide.

6. The semiconductor device of claim 2, wherein the second layer comprises polysilicon.

7. The semiconductor device of claim 2, wherein the stressor comprises oxide.

8. The device of claim 1, wherein the second layer provides more stopping power to an oxygen implant.

9. The device of claim 8, wherein the stressor comprises oxygen at a density of 1E23 cm$^{-3}$.

10. The device of claim 1, wherein the metallic element comprises tantalum.

11. The device of claim 8, wherein the no other gate stack lies between the first and second gate stacks.

12. The device of claim 1, wherein the first gate stack further comprises a gate dielectric between the semiconductor layer and the first layer over a channel between source/drain regions.

13. A semiconductor device, comprising:

a gate stack over a semiconductor layer comprising a first layer and a second layer over the first layer, the first layer is more conductive than the second layer and the first layer comprising a metallic element and having more stopping power to an implant than the second layer, the second layer including a stressor species within 10 nm of the first layer that exerts stress in the semiconductor layer in a region under the gate stack.

14. The device of claim 13 wherein a maximum concentration of the stressor species is within 10 nm of the first layer.

15. The device of claim 14, wherein the stressor species is oxygen.

16. The device of claim 13, wherein the stressor species is oxygen.

17. The device of claim 13, wherein an oxide includes the stressor species.

18. The device of claim 13, wherein no other gate stack lies between the first and second gate stacks.

19. The device of claim 13, wherein the metallic element comprises tantalum.

* * * * *